(12) United States Patent
Langhammer et al.

(10) Patent No.: US 9,032,277 B1
(45) Date of Patent: May 12, 2015

(54) PARALLEL LOW AND ASYMMETRIC RATE REED SOLOMON CODING

(75) Inventors: Martin Langhammer, Salisbury (GB); Chuck Rumbolt, St. John's (CA)

(73) Assignee: Altera Corporation, San Jose, CA (US)

(*) Notice: Subject to any disclaimer, the term of this patent is extended or adjusted under 35 U.S.C. 154(b) by 401 days.

(21) Appl. No.: 13/469,741

(22) Filed: May 11, 2012

Related U.S. Application Data

(60) Provisional application No. 61/563,989, filed on Nov. 28, 2011.

(51) Int. Cl.
H03M 13/00 (2006.01)
H03M 13/03 (2006.01)
H03M 13/15 (2006.01)

(52) U.S. Cl.
CPC ........ H03M 13/1515 (2013.01); H03M 13/153 (2013.01); H03M 13/1545 (2013.01); H03M 13/1585 (2013.01); H03M 13/157 (2013.01); H03M 13/6502 (2013.01)

(58) Field of Classification Search
CPC .......... H03M 13/1515; H03M 13/153; H03M 13/1545; H03M 13/157; H03M 13/1585; H03M 13/6502
USPC .......... 714/785, 784, 781, 792, 799, 807, 821
See application file for complete search history.

(56) References Cited

U.S. PATENT DOCUMENTS

| | | | | |
|---|---|---|---|---|
| 4,782,490 A * | 11/1988 | Tenengolts | ..................... | 714/756 |
| 4,839,896 A * | 6/1989 | Glover et al. | ................. | 714/759 |
| 5,329,535 A * | 7/1994 | Coker | ............................ | 714/762 |
| 6,131,178 A * | 10/2000 | Fujita et al. | .................... | 714/784 |
| 6,192,497 B1 * | 2/2001 | Yang et al. | ..................... | 714/781 |
| 6,279,137 B1 * | 8/2001 | Poeppelman et al. | ........ | 714/781 |
| 6,308,295 B1 * | 10/2001 | Sridharan et al. | ............. | 714/755 |
| 6,347,389 B1 * | 2/2002 | Boyer | ........................... | 714/784 |
| 6,374,383 B1 * | 4/2002 | Weng | ............................. | 714/781 |
| 6,385,751 B1 * | 5/2002 | Wolf | .............................. | 714/784 |
| 6,571,368 B1 * | 5/2003 | Chen | .............................. | 714/784 |
| 6,910,177 B2 * | 6/2005 | Cox | ............................... | 714/795 |
| 7,058,876 B1 * | 6/2006 | Ireland et al. | .................. | 714/781 |
| 7,406,651 B2 * | 7/2008 | Yoon | .............................. | 714/784 |
| 7,613,988 B1 * | 11/2009 | Wu et al. | ....................... | 714/784 |
| 7,865,809 B1 * | 1/2011 | Lee et al. | ....................... | 714/782 |
| 7,900,122 B2 * | 3/2011 | Shen et al. | ..................... | 714/784 |

(Continued)

OTHER PUBLICATIONS

Sun et al., Configurable and Scalable High Throughput Turbo Decoder Architecture for Multiple 4GWireless Standards, 2008, IEEE, pp. 209-214.*

(Continued)

Primary Examiner — John J Tabone, Jr.
(74) Attorney, Agent, or Firm — Ropes & Gray LLP

(57) ABSTRACT

In an arrangement of the disclosed systems, devices, and methods, a codeword encoded with a first number of check symbols is received and asymmetrically processed according to a second number of check symbols, where the second number of check symbols is less than the first number of check symbols, to produce an error locator polynomial and an error evaluator polynomial. A derivative of the error locator polynomial is produced by outputting a first polynomial term and a second polynomial term, wherein the second polynomial term is a constant. The derivative of the error locator polynomial is produced using a variable finite-field multiplier and without use of a divider.

15 Claims, 6 Drawing Sheets

(56) References Cited

U.S. PATENT DOCUMENTS

| | | | |
|---|---|---|---|
| 8,156,411 B2* | 4/2012 | Truong et al. | 714/785 |
| 8,266,198 B2* | 9/2012 | Lee et al. | 708/523 |
| 8,276,051 B2* | 9/2012 | Weingarten et al. | 714/781 |
| 8,667,377 B1* | 3/2014 | Mazahreh et al. | 714/784 |
| 8,875,001 B1* | 10/2014 | Mazahreh et al. | 714/781 |
| 2001/0037483 A1* | 11/2001 | Sankaran et al. | 714/782 |
| 2003/0101406 A1* | 5/2003 | Song | 714/774 |
| 2003/0229841 A1* | 12/2003 | Kravtchenko | 714/784 |
| 2008/0168336 A1* | 7/2008 | Shen et al. | 714/784 |
| 2013/0232393 A1* | 9/2013 | Przybylski | 714/773 |
| 2014/0068392 A1* | 3/2014 | Kokubun et al. | 714/785 |

OTHER PUBLICATIONS

Kristian et al., Ultra-Fast-Scalable BCH Decoder with Efficient-Extended Fast Chien Search, 2010, IEEE, pp. 338-343.*

* cited by examiner

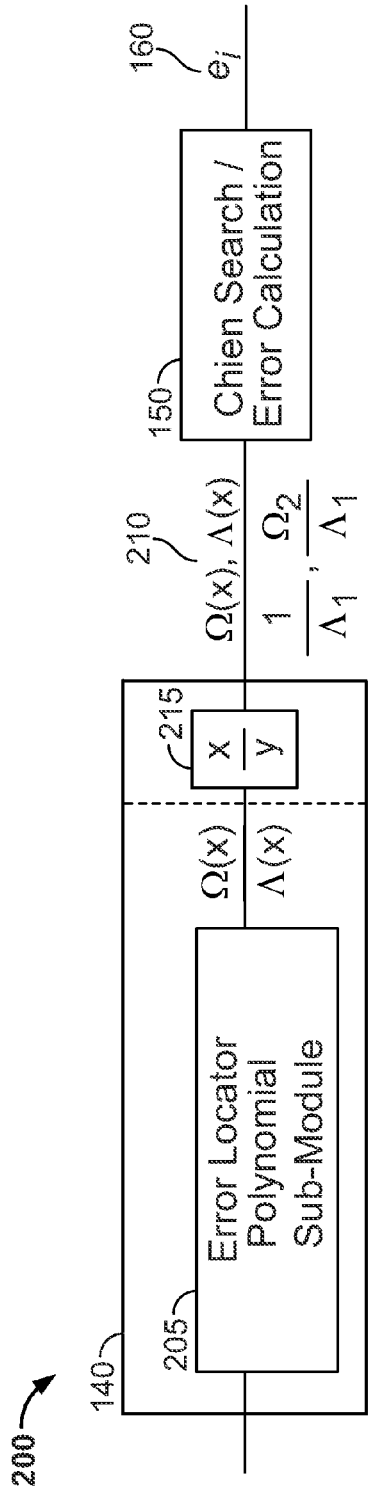
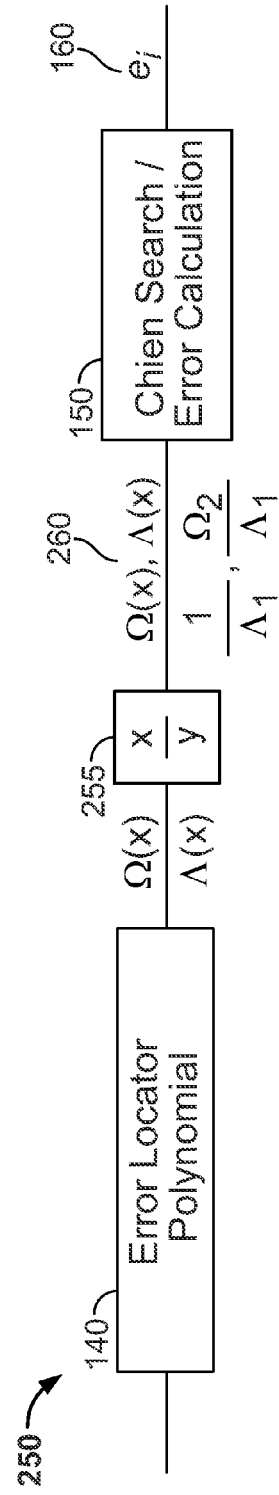
FIG. 2A
FIG. 2B

US 9,032,277 B1

PARALLEL LOW AND ASYMMETRIC RATE REED SOLOMON CODING

CROSS REFERENCE TO RELATED APPLICATION

This application claims the benefit under 35 U.S.C. §119 (e) of U.S. Provisional Application No. 61/563,989, filed Nov. 28, 2011, which is incorporated herein by reference in its entirety.

BACKGROUND OF THE INVENTION

Many modern applications encode data prior to transmission of the data on a network using cyclic error correcting codes such as Reed-Solomon codes. Such codes have the potential to provide powerful error correction capability. For example, a Reed-Solomon code of length n and including n−k check symbols may detect any combination of up to t=n−k erroneous symbols and correct any combination of up to $\lfloor t/2 \rfloor$ symbols, where $\lfloor \cdot \rfloor$ denotes the floor function. However, decoder implementations for such codes are expensive in terms of an amount of required logic, e.g., in terms of a required number of adaptive look-up tables (ALUTs), and hence, in terms of a size, monetary cost, and power consumption. For example, a typical Reed-Solomon decoder implementation requires a number of finite-field dividers, p, that scales with the codeword length n. For example, a Reed-Solomon decoder for Reed-Solomon codewords of length n=255 may require 5, 10, 15, or a larger number, of finite-field dividers.

Moreover, many modern applications transmit and receive data over high-speed networks, e.g., optical transport networks (OTNs). Such networks typically introduce data errors at a frequency much lower than an error correction capacity of a corresponding error correction code. For example, an OTN network may use a (239, 255) Reed-Solomon code, i.e., a Reed-Solomon code for which each codeword contains 239 data symbols and 255 total coded symbols. Such a code may correct any combination of up to $\lfloor t/2 \rfloor = \lfloor (n-k)/2 \rfloor = 8$ erroneous symbols occurring a received codeword. This is equivalent to the codeword being able to correct approximately a three-percent error rate of symbols in the received codeword. However, actual error rates experienced on OTN networks are in the range of $10^{-9}$ to $10^{-15}$ errors per symbol. Thus, the typical Reed-Solomon code provides an error correction capability in excess of a required error correction capability (and hence utilizes a decoder having implemented with an excess amount of logic circuitry).

Further, high-speed networks typically require some form of data pipelining to attain a satisfactory decoding output rate. Pipelining typically requires a large amount of duplicative circuitry. Finite-field dividers, in particular, are typically duplicated in decoder implementations for high speed networks and often result in a substantial amount of required logic circuitry.

SUMMARY OF THE INVENTION

Described herein are systems, devices, and methods for producing a recovered codeword from a received codeword. Codeword processing circuitry includes receiver circuitry to receive a codeword encoded with a first number of check symbols, decoding circuitry to asymmetrically process the received codeword according to a second number of check symbols, where the second number of check symbols is less than the first number of check symbols, to produce a plurality of error values, and data recovery circuitry to process the received codeword using the plurality of error values to produce a recovered codeword.

In certain arrangements, the decoding circuitry includes syndrome computation circuitry to asymmetrically process the received codeword according to the second number of check symbols to produce a plurality of syndrome values and error locator polynomial circuitry to process the plurality of syndrome values to produce an error locator polynomial and an error evaluator polynomial corresponding to the received codeword and the second number of check symbols. In certain arrangements, the decoding circuitry includes at most one variable finite-field divider, which is included in the error locator polynomial circuitry. In certain arrangements, the error locator polynomial circuitry is further configured to produce a derivative of the error locator polynomial by outputting a first polynomial term and a second polynomial term, where the second polynomial term is a constant.

In certain arrangements, the decoding circuitry includes error search and calculation circuitry to produce the plurality of error values based on the error locator polynomial and the error evaluator polynomial, and the decoding circuitry provides the plurality of error values to the data recovery circuitry. In certain arrangements, the error locator polynomial circuitry is outputs an inverse of a denominator of the first polynomial term using a variable finite-field multiplier by processing a corresponding input over a plurality of clock cycles. In certain arrangements, the receiver circuitry provides the received codeword to a data delay buffer and the data delay buffer delays an output of the received codeword for a number of clock cycles required for the syndrome computation circuitry, the error locator polynomial circuitry, and the error search and calculation circuitry to asymmetrically process the received codeword.

In certain arrangements, the error search and calculation circuitry performs an error search and calculation corresponding to each of p symbol locations of the received codeword in p parallel stages and outputs a corresponding plurality of p error values in a clock cycle. In certain arrangements, the error locator polynomial circuitry outputs the inverse of the denominator of the first polynomial term by using an inverse power of a root of the error locator polynomial.

Also described herein are systems, devices, and methods for producing a recovered codeword by modifying the received codeword using the plurality of p error values. Syndrome computation circuitry processes a received codeword to produce a plurality of syndrome values. Error locator polynomial circuitry processes the plurality of syndrome values to produce an error locator polynomial and an error evaluator polynomial corresponding to the received codeword. Error search and calculation circuitry arranged in a plurality of p parallel stages outputs, in a single clock cycle, a corresponding plurality of p error values for the received codeword based on the error locator polynomial and the error evaluator polynomial. Codeword recovery circuitry produces a recovered codeword by modifying the received codeword using the plurality of p error values.

In certain arrangements, the decoding circuitry includes exactly one variable divider, which is included in the error locator polynomial circuitry. In certain arrangements, the decoding circuitry includes p variable finite-field multipliers, and each variable finite-field multiplier of the p variable finite-field multipliers is included in a respective parallel stage of error search and calculation circuitry of the plurality of p parallel stages of the error search and calculation circuitry. In certain arrangements, the decoding circuitry includes at most p variable finite-field multipliers and includes no variable dividers.

In certain arrangements, the error locator polynomial circuitry produces a derivative of the error locator polynomial by outputting a first polynomial term and a second polynomial term, where the second polynomial term is a constant. In certain arrangements, the error locator polynomial circuitry is further configured to output an inverse of a denominator of the first polynomial term using a variable finite-field multiplier by processing a corresponding input over a plurality of clock cycles. In certain arrangements, the error locator polynomial circuitry is further configured to output the inverse of the denominator of the first polynomial term by using an inverse power of a root of the error locator polynomial.

Also described herein are systems, devices, and methods for processing a codeword. A codeword encoded with a first number of check symbols is received and the received codeword is asymmetrically processed according to a second number of check symbols, where the second number of check symbols is less than the first number of check symbols, to produce a plurality of error values. The received codeword is modified based on the plurality of error values to produce a recovered codeword. In certain arrangements, the received codeword is asymmetrically processed according to the second number of check symbols to produce plurality of syndrome values and the plurality of syndrome values are processed to produce an error locator polynomial and an error evaluator polynomial corresponding to the received codeword and the second number of check symbols.

In certain arrangements, a derivative of the error locator polynomial is produced by outputting a first polynomial term and a second polynomial term, where the second polynomial term is a constant. In certain arrangements, the derivative of the error locator polynomial is produced using a variable finite-field multiplier and without use of a divider.

Also described herein are systems, devices, and methods for symmetrically decoding a received codeword. Receiver circuitry receives a codeword, error locator polynomial circuitry processes the received codeword according to a symmetric decoding scheme to produce an error locator polynomial and an error evaluator polynomial corresponding to the received codeword, and error search and calculation circuitry arranged in plurality of p parallel stages outputs, in a single clock cycle, a corresponding plurality of p error values for the received codeword based on the error locator polynomial and the error evaluator polynomial and the symmetric decoding scheme, and codeword recovery circuitry produces a recovered codeword by modifying the received codeword. In certain arrangements, the received codeword is a (251, 255) encoded Reed-Solomon codeword, and each of the error locator polynomial circuitry and the error search and calculation circuitry process the received codeword according to a symmetric (251, 255) Reed-Solomon decoding scheme.

BRIEF DESCRIPTION OF THE DRAWINGS

The above and other advantages of the invention will be apparent upon consideration of the following detailed description, taken in conjunction with the accompanying drawings, in which like referenced characters refer to like parts throughout, and in which:

FIG. 2A illustrates a more detailed architecture of the error locator polynomial module and the Chien search and error calculation module depicted in FIG. 1 in accordance with an arrangement of the present invention;

FIG. 2B illustrates another more detailed architecture of the error locator polynomial module and the Chien search and error calculation module depicted in FIG. 1 in accordance with an arrangement of the present invention;

DETAILED DESCRIPTION OF THE INVENTION

Disclosed herein are methods, systems, and apparatus for implementing Reed-Solomon decoders, and other types of decoders, in a network environment. The disclosed methods, systems, and apparatus advantageously reduce a number of ALUTs required for a decoder implementation in a pipelined architecture. As described herein, such advantages are achieved in various arrangements by using an asymmetric decoder (i.e., a decoder that is functional to correct less than a maximum number of correctable codewords in a Reed-Solomon codeword) and/or by reducing or eliminating a number of finite-field dividers required per pipeline stage in a decoder implementation.

Figure 1:
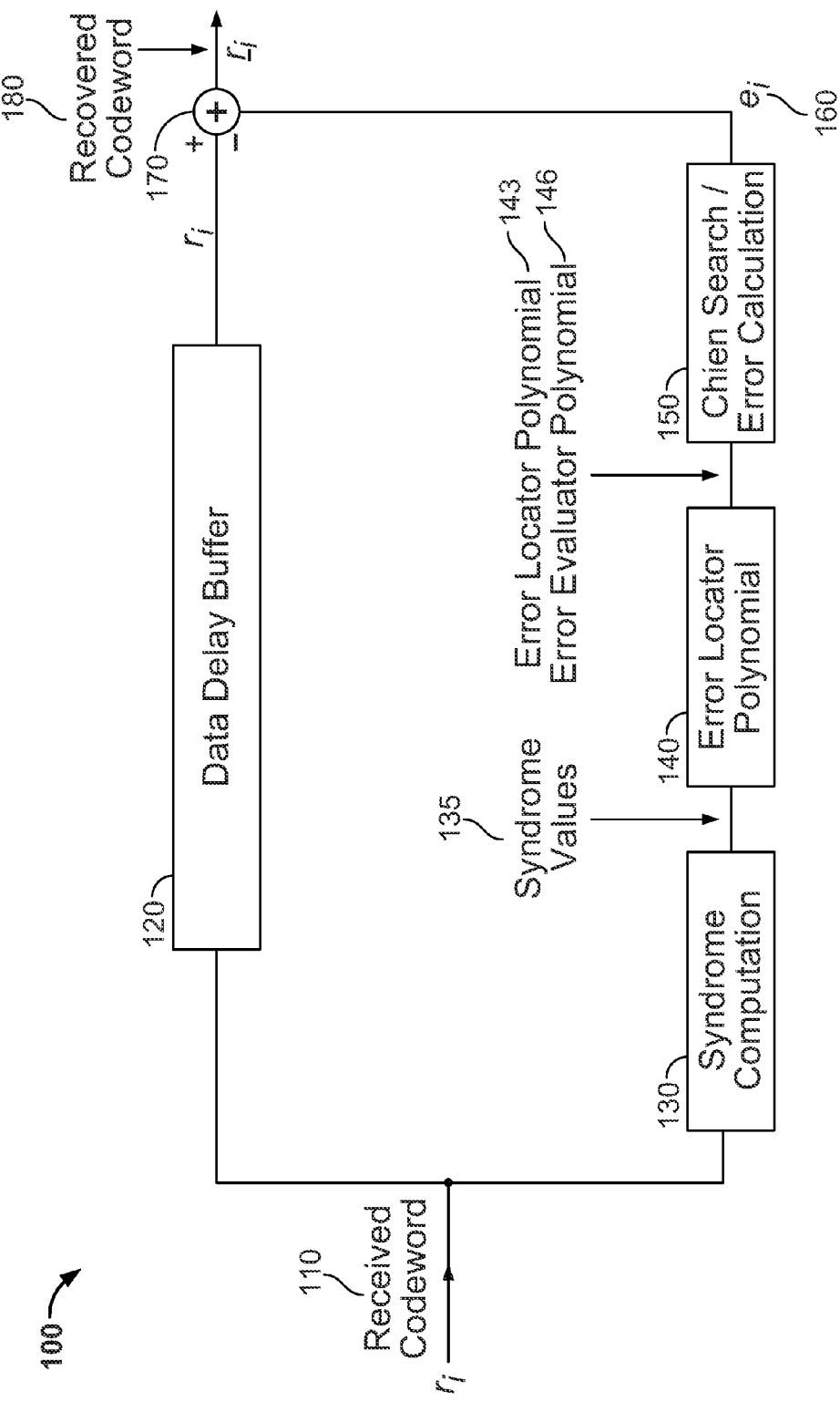
FIG. 1 illustrates a pipelined Reed-Solomon decoding architecture in accordance with an arrangement of the present invention.

FIG. 1 illustrates a pipelined Reed-Solomon decoding architecture in accordance with an arrangement of the present invention. A decoder 100 is used to sequentially process received codewords to recover corresponding datawords. The decoder 100 receives the codewords through receiver circuitry (not illustrated in FIG. 1) over a wired, wireless, or hybrid network. In an arrangement, codewords are received over a high-speed OTN having a throughput on the order of 10 to 100 Gbits/second and an average symbol error rate in the range of $10^{-9}$ to $10^{-15}$ errors per received symbol.

The decoder 100 receives a codeword 110, which has n symbols of which k symbols correspond to data symbols and n–k symbols correspond to check symbols. Accordingly, the received codeword 110 will also be denoted by its symbols $r_1, \ldots, r_n$ or generically by the symbol $r_i$. In an arrangement, the received codeword 110 is generated by a (239, 255) Reed-Solomon code (i.e., k=239 and n=255) with each symbol conveying m=8 bits of information. As is conventional, the number of possible values for a given code symbol will be denoted by $q^m$ where q and m are each integers (stated in other terms, code symbols are selected from $GF(q^m)$, where $GF(u)$ denotes the Galois field of order u). Here, q=2 and m=8. In other arrangements of the present invention, other values of k, n, and/or $q^m$ are used.

The received codeword 110 is provided to a data delay buffer 120 and a syndrome computation module 130. As used herein, the term "module" refers to any suitable circuitry used to implement the functionality described in relationship to the module. In one arrangement, the functionality of a given module is implemented primarily (or fully) in FPGA-based logic. The data delay buffer 120 delays (e.g., stores in registers) output of the received codeword 110 for a length of time (i.e., a number of clock cycles) sufficient for all or a portion of the received codeword 110 to be processed by the syndrome computation module 130, an error locator polynomial module 140, and a Chien search and error calculation module 150.

In an arrangement, the decoder 100 operates on an asymmetric basis with a corresponding encoder used to encode the received codeword 110 (the encoder is not illustrated in FIG. 1). In particular, while the encoder encodes words using a (k, n) coding scheme which has the capability to correct any combination of up to $\lfloor(n-k)/2\rfloor$ symbol errors, the decoder 100 is configured to recognize (and correct) only a smaller number of possible errors in the received codeword 110 and, hence, "asymmetrically processes" the received codeword.

An asymmetric decoder is potentially significantly less logic-intensive than a "symmetric decoder" while still providing satisfactory decoding performance in certain conditions, e.g., when a channel over which codewords are transmitted is better than a worst-case channel quality for which the code parameters k and n are designed. For example, in an arrangement, an encoder encodes data using a (239, 255) Reed-Solomon code, in which up to 8 symbol errors could be corrected by a symmetric decoder (i.e., a decoder that is implemented to recognize all 16 check symbols of the (239, 255) code). However, to simplify implementation, the decoder 100 may be implemented as an asymmetric (251, 255) decoder, which is capable of correcting up to (255−251)/2=2 symbol errors in the received codeword 110, or a (253, 255) decoder, which is capable of correcting up to (253−251)/2=1 symbol error in the received codeword 110. The positive integer valued parameter t will be used herein to discusses the number of symbol errors that the decoder 100 is capable of correcting.

The syndrome computation module 130 processes the received codeword 110 to obtain 2t syndrome values 135 corresponding to the received codeword 110. The syndrome values 135 will also be denoted $S_1, \ldots, S_{2t}$. For example, in the case of a (251, 255) decoder, which is characterized by the value t=2, the syndrome values are denoted $S_1, S_2, S_3$, and $S_4$. As would be understood by one of ordinary skill, based on the disclosure and teachings herein, the received codeword 110 is associated with a corresponding received codeword polynomial and a generator polynomial. Further, the syndrome values 135 are calculated by evaluating the received codeword polynomial at values that are roots of the generator polynomial. Any suitable technique may be used to determine the syndrome values 135.

The error locator polynomial module 140 processes the syndrome values 135 to produce an error locator polynomial 143 and an error evaluator polynomial 146. The error locator polynomial 143 and the error evaluator polynomial 146 will also denoted herein by $\Lambda(x)$ and $\Omega(x)$, respectively. As would be understood by one of ordinary skill, based on the disclosure and teachings herein, the error locator polynomial 143 and the error evaluation polynomial 146 may be derived from the syndrome values 135 using any suitable technique. For example, in respective arrangements, the error locator polynomial module 140 includes functionality implementing the Peterson-Gorenstein-Zierler algorithm, Berlekamp-Massey algorithm, and Galois-field Fourier transform method.

Regardless of the techniques used to derive the error locator polynomial 143 and the error evaluator polynomial 146, each of these quantities may be represented by a polynomial in a Galois field of order m. Specifically, the error evaluator polynomial 146 is represented by the polynomial $$\Omega(x)=(\Omega_1+\Omega_2 x+\Omega_3 x^2 \ldots), \quad (1)$$

where each of the coefficients $\Omega_i$ are from the Galois field of order m. Similarly, the error locator polynomial 143 is represented by the polynomial $$\Lambda(x)=\Lambda_0+\Lambda_1 x+\Lambda_2 x^2+\Lambda_3 x^3+\Lambda_4 x^4+\Lambda_5 x^5+ \quad (2)$$

and the formal derivative of the error locator polynomial 146 is represented by the polynomial $$\Lambda'(X)=X(\Lambda_1+\Lambda_3 x^2+\Lambda_5 X^4 \ldots), \quad (3)$$

where the coefficients $\Lambda_i$ are from the Galois field of order m. As would be understood by one of ordinary skill, based on the disclosure and teachings herein, the error locator polynomial 146 is used to perform a Chien search, while the derivative of the error locator polynomial 146 is used to evaluate error values.

The error locator polynomial 143 and the error evaluator polynomial 146 are provided to the Chien search and error calculation module 150 to produce error values 160. The errors values 160 will also be denoted by $e_1, \ldots e_n$, where $e_i$ denotes the value of the error in the $i^{th}$ position of the received codeword 110.

To determine the error values 160, the Chien search and error calculation module 150 implements both a Chien search module, to identify symbol locations containing errors in the received codeword 110, and an error value calculation module, to determine the error values at the identified symbol locations. As would be understood by one of ordinary skill, based on the disclosure and teachings herein, the Chien search module determines the roots, if any, of the error locator polynomial 143. In particular, the Chien search module is implemented by evaluating the error locator polynomial at each value of the appropriate Galois field corresponding to a respective location in the received codeword 110 to determine if the error locator polynomial has a value equal to 0 at that location. If so, the received codeword 110 is identified as having an error at that location. If not, the received codeword 110 is identified as being error-free at that location.

Equivalently, instead of comparing evaluated values of the error locator polynomial to the value 0, the Chien search module may compare, in an algebraically identical or equivalent way, a value of the error locator polynomial minus the value 1 to the value 1 for convenience of implementation. Similarly, the Chien search module may perform any other algebraically equivalent comparison to that described herein.

The Chien search and error calculation module 150 determines an error value $e_i$ for each location of the received codeword 110 identified by Chien search module as containing a symbol error. In particular, the Chien search module evaluates error values using a technique based on the Formey algorithm. Using the Formey algorithm, the Chien search module determines the error values $e_i$ according to the following relationship $$e_i = \frac{\Omega(x^{-i})}{\Lambda'(x^{-i})} \quad (4)$$

One of ordinary skill would understand, based on the disclosure and teaching herein, that the Chien search module may also determine the error values $e_i$ using an allegorically equivalent relationship.

As will be explained subsequently in this disclosure, the Chien search module of the Chien search and error calculation module 150 evaluates equation (4) using a representation having relatively low cost implementation requirements, e.g., in terms of a number of finite-field variable dividers required for implementation. The error values 160 are provided to an adder 170. At the adder 170, the error values 160 are subtracted from corresponding values of the received codeword 110 to produce a recovered codeword 180. The recovered codeword 180 will also be denoted by its symbols $r_1, \ldots, r_n$ or generically by the symbol $r_i$. If the number of symbol errors in the received codeword is less than or equal to the value of t, then the recovered codeword 180 is error-free. Otherwise, the recovered codeword 180 may contain one or more symbol errors.

The decoder 100 is a pipelined architecture. In particular, while the received codeword 110 is of length n symbols, the Chien search and error calculation module 150 processes symbols in parallel groups of p symbols per clock cycle. In general, the number of clock cycles required for the Chien search and error calculation module 150 to process the received codeword 110 is $\lfloor n/p \rfloor$, where $\lceil \cdot \rceil$ denotes the ceiling function. For example, in an arrangement n=255 and p=5. In this arrangement, decoding the received codeword 110 using the decoder 100 requires $\lfloor n/p \rfloor = 51$ clock cycles. In each clock cycle, a Chien search and error calculation are performed for a corresponding p symbol locations of the received codeword 110.

For the purposes of illustration, the disclosure herein will illustrate methods, systems, and apparatus for implementing Reed-Solomon decoders, and other types of decoders, for the case where the decoder 100 is characterized by the value t=2. When t=2, the error evaluator polynomial 146 reduces to $$\Omega(x) = \Omega_1 + \Omega_2 x \quad (5)$$

and the error locator polynomial 143 reduces to $$\Lambda'(x) = \Lambda_1 x. \quad (6)$$

Arrangements of the decoder 100 with reduced complexity are based on substituting equations (4) and (6) into the error value relationship of equation (4) and performing algebraic manipulations. Specifically, the error values $e_i$ may be determined according to the following relationship $$e_i = \frac{\Omega(x^{-i})}{\Lambda'(x^{-i})} = \frac{\Omega_1}{\Lambda_1(x^{-i})} + \frac{\Omega_2 x^i}{\Lambda_1 x^i} = \frac{\Omega_1}{\Lambda_1(x^{-i})} + \frac{\Omega_2}{\Lambda_1}. \quad (7)$$

The representation of $e_i$ provided in equation (7) shows that the second polynomial term in the equation, $\Omega_2/\Lambda_1$, is a constant with respect to a symbol-position i of a codeword and may therefore be pre-computed and added to calculation of the first polynomial term in equation (7). This results in a logic savings for a decoder because Galois field adders are inexpensive and can be implemented, e.g., using a bitwise-XOR circuit. Three architectures for evaluating of the expression $e_i$ provided in equation (7) are described next.

As reflected in the first polynomial term on the right hand side of equation (7), the inverse of the coefficient $\Lambda_1$ is evaluated at the inverse exponent of the corresponding symbol location. As described thus far, the exponent of the primitive root of the Galois field is −i and instead the exponent should be i. Depending on the search direction of the decoder 110 (i.e., from first received symbol to last received symbol, or from the last received symbol to the first), the search exponent is i, in which case the inverse of the coefficient $\Lambda_1$ is multiplied by −i.

FIG. 2A illustrates a more detailed architecture of the error locator polynomial module 140 and the Chien search and error calculation module 150 in accordance with an arrangement of the present invention. As illustrated in architecture 200, the error locator polynomial module 140 includes an error locator polynomial sub-module 205, which processes the syndrome values 135 to produce the error locator polynomial $\Lambda(x)$ 143 (i.e., the coefficients $\Lambda_1$ and $\Lambda_2$) and the error evaluator polynomial $\Omega(x)$ 146 (i.e., the coefficients $\Omega_1$ and $\Omega_2$). Next, certain of these quantities are processed by a finite-field variable divider 215 to produce the other quantities needed for a Chien search and error calculation, namely, the quantities $1/\Lambda_1$ and $\Omega_2/\Lambda_1$. Error locator polynomial module 140 passes output parameters 210, i.e., the quantities $\Lambda_1$, $\Lambda_2$, $\Omega_1$, $\Omega_2$, $1/\Lambda_1$, and $\Omega_2/\Lambda_1$, to the Chien search and error calculation module 150.

As would be understood by one of ordinary skill, based on the disclosure and teachings herein, the separation between circuitry implementing the finite-field variable divider 215 and circuitry implementing the error locator polynomial sub-module 205 may be merely logical rather than physical. The finite-field variable divider 215, like all of the dividers described in this disclosure, may be implemented using digital logic, memory, or a combination thereof.

FIG. 2B illustrates another more detailed architecture of the error locator polynomial module 140 and the Chien search and error calculation module 150 in accordance with an arrangement of the present invention. As illustrated in architecture 250, circuitry implementing a finite-field variable divider 255 is physically separated from circuitry implementing the error locator polynomial module 140 and circuitry implementing the Chien search and error calculation module 150. As illustrated, the error locator polynomial module 140 passes the error locator polynomial $\Lambda(x)$ 143 (i.e., the coefficients $\Lambda_1$ and $\Lambda_2$) and the error evaluator polynomial $\Omega(x)$ 146 (i.e., the coefficients $\Omega_1$ and $\Omega_2$) to the finite-field variable divider 255, which produces the quantities $1/\Lambda_1$ and $\Omega_2/\Lambda_1$. The finite-field variable divider 255 then passes output parameters 260, i.e., the quantities $\Lambda_1$, $\Lambda_2$, $\Omega_1$, $\Omega_2$, $1/\Lambda_1$, and $\Omega_2/\Lambda_1$, to the Chien search and error calculation module 150.

Figure 2C:
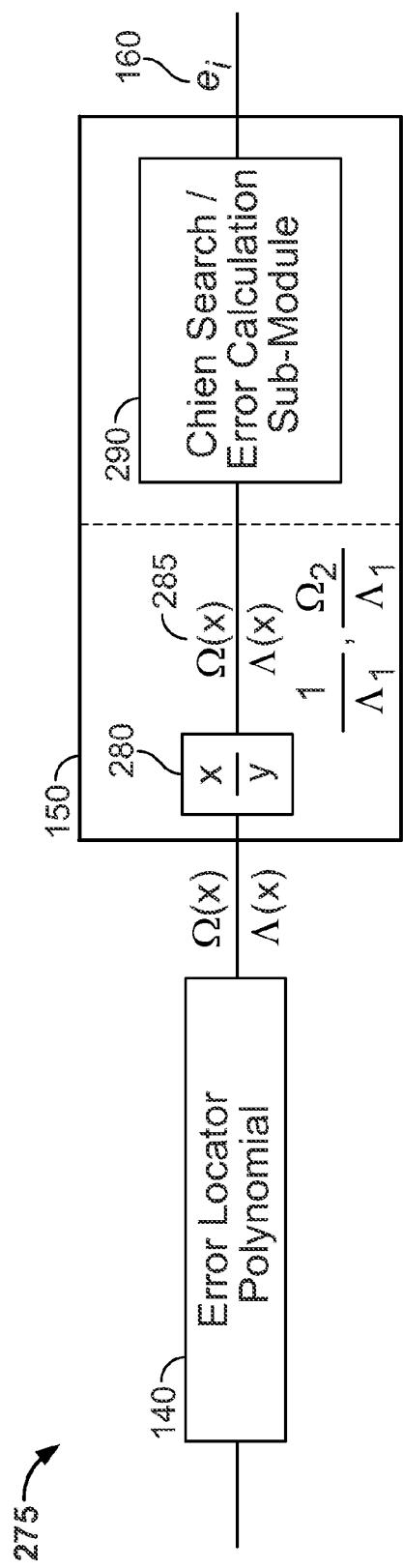
FIG. 2C illustrates yet another more detailed architecture of the error locator polynomial module and the Chien search and error calculation module depicted in FIG. 1 in accordance with an arrangement of the present invention.

FIG. 2C illustrates yet another more detailed architecture of the error locator polynomial module 140 and the Chien search and error calculation module 150 in accordance with an arrangement of the present invention. As illustrated in architecture 275, the Chien search and error calculation module 150 receives the error locator polynomial $\Lambda(x)$ 143 (i.e., the coefficients $\Lambda_1$ and $\Lambda_2$) and the error evaluator polynomial $\Omega(x)$ 146 (i.e., the coefficients $\Omega_1$ and $\Omega_2$) from the error locator polynomial module 140. As further illustrated in architecture 275, the Chien search and error calculation module 150 includes a finite-field variable divider 280 and a Chien search and error calculation sub-module 290. In particular, the finite-field variable divider 280 processes the error locator polynomial $\Lambda x$ 143 and the error evaluator polynomial $\Omega(x)$ 146 to produce the other quantities needed for a Chien search and error calculation, i.e., $1/\Lambda_1$ and $\Omega_2/\Lambda_1$. The quantities $\Lambda_1$, $\Lambda_2$, $\Omega_1$, $\Omega_2$, $1/\Lambda_1$, and $\Omega_2/\Lambda_1$ are provided to the Chien search and error calculation sub-module 290, which produces the error values 160.

In one arrangement, the separation between circuitry implementing the divider 280 and circuitry implementing the Chien search and error calculation sub-module 290 are physically separated. In another arrangement, the separation between circuitry implementing the divider 280 and circuitry implementing the Chien search and error calculation sub-module 290 are only logically separated. Further, to the extent that a single variable finite-field divider is included in decoder 255, the divider may not be a separate divider at all (e.g., may not resemble any of the variable finite-field dividers 215, 255, and 280), but rather, may be a divider already included (and reused) in the error locator polynomial module 140.

Figure 3:
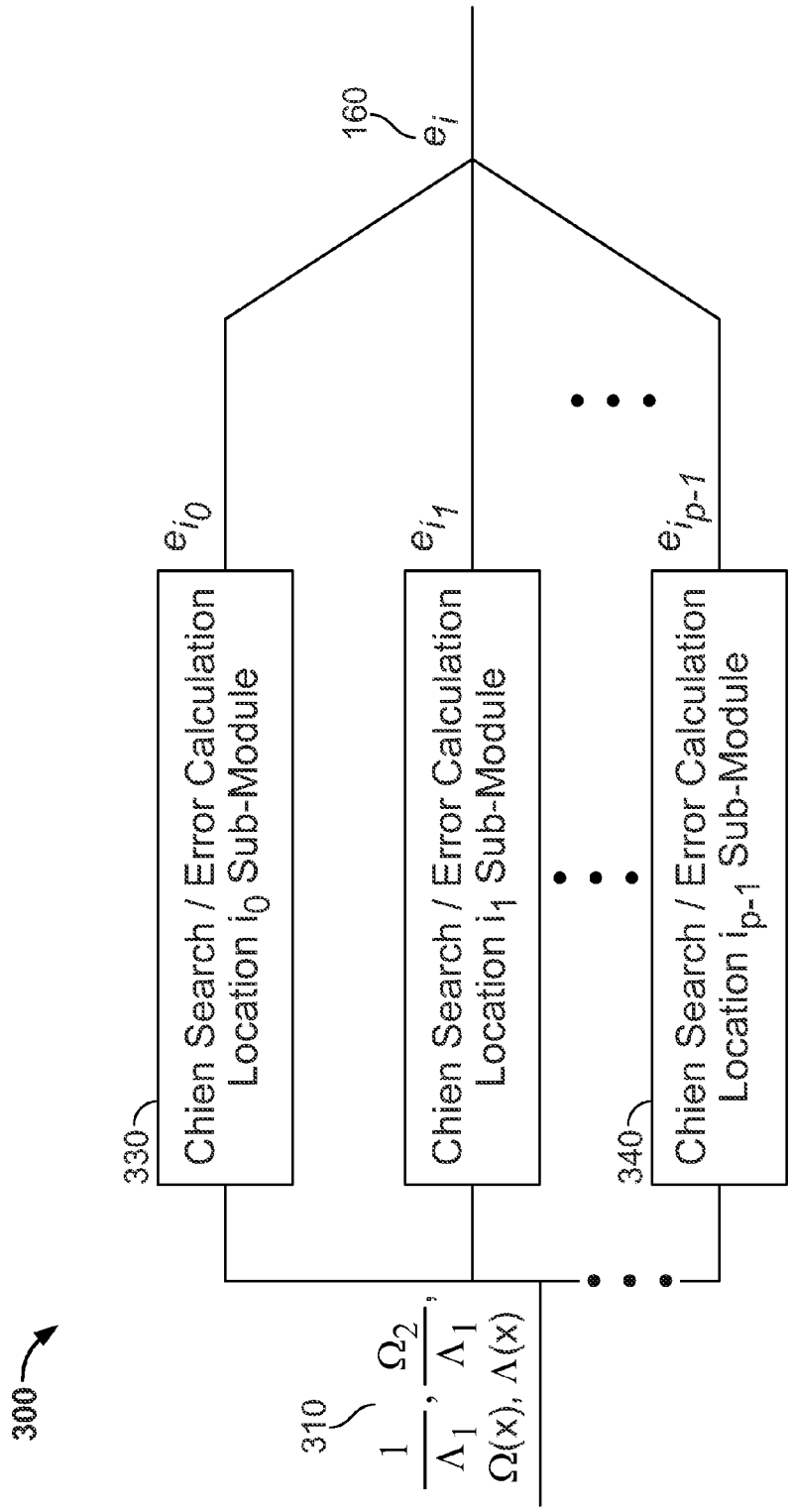
FIG. 3 illustrates a more detailed architecture of a Chien search and error calculation module in accordance with an arrangement of the present invention.

FIG. 3 illustrates a more detailed architecture of a Chien search and error calculation module in accordance with an arrangement of the present invention. Architecture 300 is implemented as the Chien search and error calculation module 150 in accordance with an arrangement of the present invention. For example, architecture 300 may be implemented as the Chien search and error calculation sub-module 290 in accordance with an arrangement of the present invention. As illustrated by architecture 300, input parameters 310 are received. The input parameters 310 correspond to the output parameters 210, the output parameters 260, or the output parameters 285 and includes the quantities $\Lambda_1$, $\Lambda_2$, $\Omega_1$, $\Omega_2$, $1/\Lambda_1$, and $\Omega_2/\Lambda_1$.

Architecture 300 is a pipelined architecture in which p symbol error locations of the received codeword 110 are identified (via a Chien search) and corresponding error values evaluated in each clock cycle. In particular, as illustrated in architecture 300, input parameters 310 are provided to Chien search and error calculation location $i_o$ sub-module 330 through Chien search and error calculation location $i_{p-1}$ sub-module 340. Each of these p modules calculates a corresponding error value from $e_{i_o}$ to $e_{i_{p-1}}$ in a parallel with the other p−1 modules.

As an example, in one arrangement of the present invention, the decoder 100 implements the architecture 275 as the Chien search and error calculation module 150. Further, the decoder 100 receives codewords that have been encoded using a (239, 255) Reed-Solomon code over an OTN. Further, the decoder 100 is a (251, 255) decoder and thus is asymmetric with respect to the encoder. The degree of parallelization (i.e., the value of p) is equal to 5, so that it takes a total of 51 clock cycles for the architecture 300 to process all 255 symbols of the received codeword 110. That is, in each of the 51 clock cycles, the architecture 300 check error locations and outputs corresponding error values $e_i$ for exactly 5 symbol positions of the received codeword 110. Thus, the number of clock cycles required for the decoder 100 to process a codeword in this example is 51 clock cycles plus a number of clock cycles required by the syndrome computation module 130, the error locator polynomial module 140, and the adder 170 to perform their respective functions, as described above.

Figure 4A:
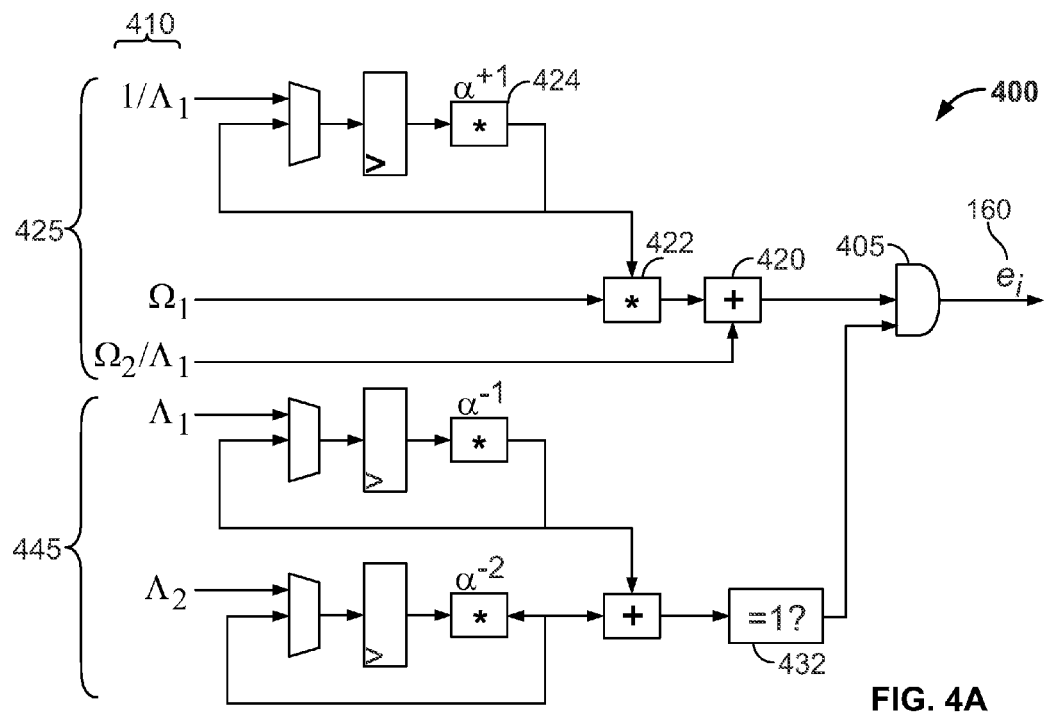
FIG. 4A illustrates a circuitry-based implementation of one of the Chien search and error calculation location sub-modules depicted in FIG. 3 in accordance with an arrangement of the invention.

FIG. 4A illustrates a circuitry-based implementation of one of the Chien search and error calculation sub-modules depicted in FIG. 3 in accordance with an arrangement of the invention. In a one arrangement, circuitry 400 is used to implement each of Chien search and error calculation location $i_o$ sub-module 330 through Chien search and error calculation location $i_{p-1}$ sub-module 340 (i.e., a total of p copies of the circuitry 400 are included in an implementation of the decoder 100). The circuitry 400 receives input parameters 410. Error calculation circuitry 425 processes certain of the input parameters 410, i.e., $\Omega_1$, $1/\Lambda_1$, and $\Omega_2/\Lambda_1$ to produce an error value $e_i$ according to the relationship described by equation (7). As illustrated, the quantity $1/_i$ is evaluated by the positive exponent of the root at multiplier 424 rather than at the negative exponent.

Chien search circuitry 445 performs a Chien search of the error locator polynomial $\Lambda(x)$ 143 (i.e., by processing the coefficients $\Lambda_1$ and $\Lambda_2$) for a given value of x to determine if the error locator polynomial 143 has a root at the value of x. If so, the output of a comparator 432 is equal to the value 1. Otherwise, the output of the comparator 432 is equal to the value 0. An AND gate 405 passes the output of the adder 420 as $e_i$ only if the output of the comparator 432 is 1. Otherwise, the AND gate 405 passes a value 0. Thus, for a given symbol location i, the error value $e_i$ 160 denotes the value of error in position i of the received codeword 110.

The circuitry 400 does not include any variable or constant dividers but only multipliers and adders. As illustrated, the circuitry 400 only requires three constant multipliers and one variable finite-field multiplier 422. Thus, the circuitry 400 may be implemented at a significantly smaller logic complexity than a functionally equivalent circuitry using one or more variable dividers (e.g., in place of the variable multiplier 422).

For example, a constant finite-field multiplier requires about 12 ALUTs (including a multiplexer and register) and a variable finite-field multiplier requires about 40 ALUTs. A variable finite-field divider, on the other hand, requires about 120 ALUTs if implemented in logic or 40 ALUTs and an embedded memory block. Thus, in an implementation of the decoder 100 with 16 channels and a parallelization factor of p=5 per channel, an alternate implementation of the circuitry 400 that used a variable divider in place of the variable multiplier 422 would require an additional 6,400 ALUTs (or 80 memory blocks) as compared to the no divider implementation of the circuitry 400.

The decoder 100 and the architecture 300 correspond to a single decoder. However, as would be understood by one of ordinary skill, based on the disclosure and teachings herein, a decoding system may utilize a number of decoders resembling decoder 100 in parallel. For example, in a 100G OTN decoding system, there may be 16 decoders, each of which may be implemented as shown in FIG. 1.

Figure 4B:
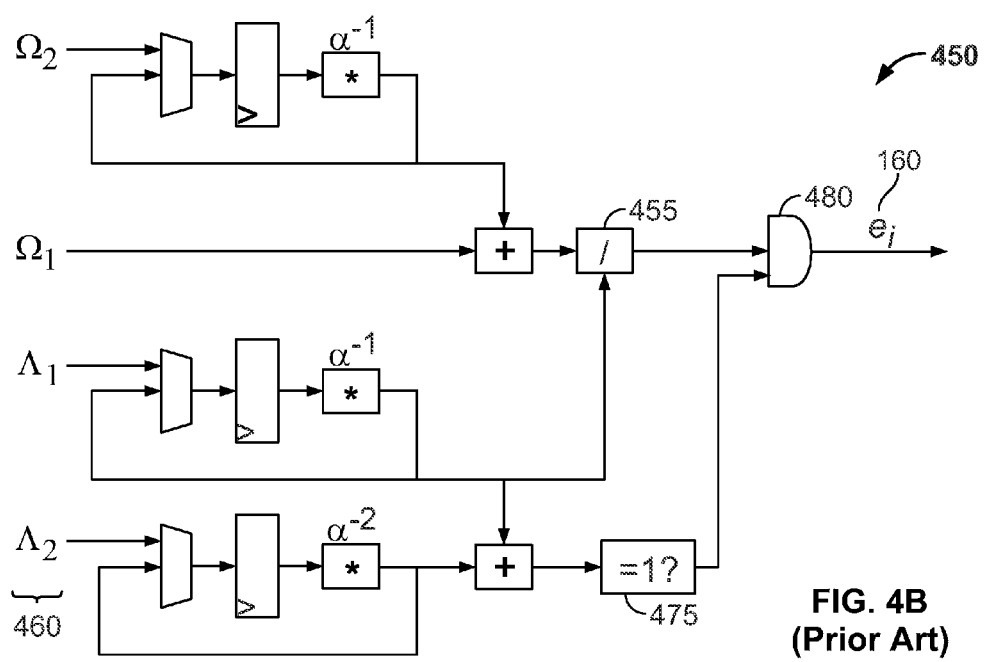
FIG. 4B illustrates another circuitry-based implementation of one of the Chien search and error calculation location sub-modules depicted in FIG. 3 in accordance with an arrangement of the invention.

FIG. 4B illustrates another circuitry-based implementation of one of the Chien search and error calculation location sub-modules depicted in FIG. 3 in accordance with an arrangement of the invention. FIG. 4B shows a known method of searching for error locations and calculating error values. In contrast to circuitry 400 of FIG. 4A, polynomial terms are not preprocessed in circuitry 450. For example, there is no computation of an inverse polynomial term of the error locator polynomial and there is no computation of a constant polynomial term for evaluating error values in circuitry 450.

In an arrangement, an implementation of circuitry 450 is used to implement each of Chien search and error calculation location $i_o$ sub-module 330 through Chien search and error calculation location $i_{p-1}$ sub-module 340 (i.e., a total of p copies of the circuitry 450 are included in an implementation of the decoder 100). As illustrated, the circuitry 450 includes one variable finite-field divider 455, three multipliers, and a number of adders.

The circuitry 450 receives the error locator polynomial $\Lambda(x)$ 143 (i.e., the coefficients $\Lambda_1$ and $\Lambda_2$) and the error evaluator polynomial $\Omega(x)$ 146 (i.e., the coefficients $\Omega_1$ and $\Omega_2$). The circuitry 450 processes the input parameters 460 to produce an error evaluation value according to the relationship described by equation (7).

The circuitry 450 also performs a Chien search of the error locator polynomial $\Lambda(x)$ 143 (i.e., using the coefficients $\Lambda_1$ and $\Lambda_2$) for a given value of x to determine if the error locator polynomial 143 has a root at that value of x. If so, the output of comparator 475 is equal to the value 1. Otherwise, the output of the comparator 475 is equal to the value 0. An AND gate 480 passes the output of the divider 455 as $e_i$ only if the output of the comparator 475 is 1. Otherwise, the AND gate 480 passes a value 0. Thus, for a given symbol location i, the error value $e_i$ 160 denotes the value of any error in the corresponding positions of the received codeword 110.

Several different permutations (or combinations) of the aforementioned architectures 200, 250, 275, 300 and circuitries 400 and 450 described in relation to FIGS. 2A-4 may be used to limit a number of finite-field dividers included in an implementation of decoder 100. For example, in one implementation, the decoder 100 is implemented as architecture 200 with the Chien search and error calculation module 150 implemented as the architecture 300. Further, each of the p parallel paths of the architecture 300 are implemented using the circuitry 400, resulting in a total of one variable finite-field divider in the implementation of the decoder 100. In another implementation, the decoder 100 is implemented as architecture 200 with the Chien search and error calculation module 150 implemented as the architecture 300, and each of the p parallel paths of the architecture 300 are implemented using the circuitry 450. This results in exactly p+1 variable finite-field dividers.

In general, any of the variable finite-field dividers 215, 255, and 280 may be replaced by a variable finite-field multiplier. In particular, suppose a variable finite-field divider computes a quantity expressed by X/Y. Using Fermat's theorem, a finite-field multiplier may be used to compute the quantity 1/Y in the given Galois field via processing over multiple clock cycles. The output of the quantity 1/Y by the multiplier may then be multiplied by the value X to provide an output value X/Y without use of a divider. Further, the multiplier may be implemented in the error locator polynomial module 140. If the resultant total number of clock cycles required by the polynomial calculation function of the error locator polynomial module 140 and computation of the quantity 1/Y is less than $\lfloor n/p \rfloor$ then throughput will not be lessened through use of the multiplier in place of a divider. On the other hand, if the total number of clock cycles is greater than $\lfloor n/p \rfloor$, then the divider may be moved to a separate block at the expense of additional latency in the decoder 100.

Figure 5:
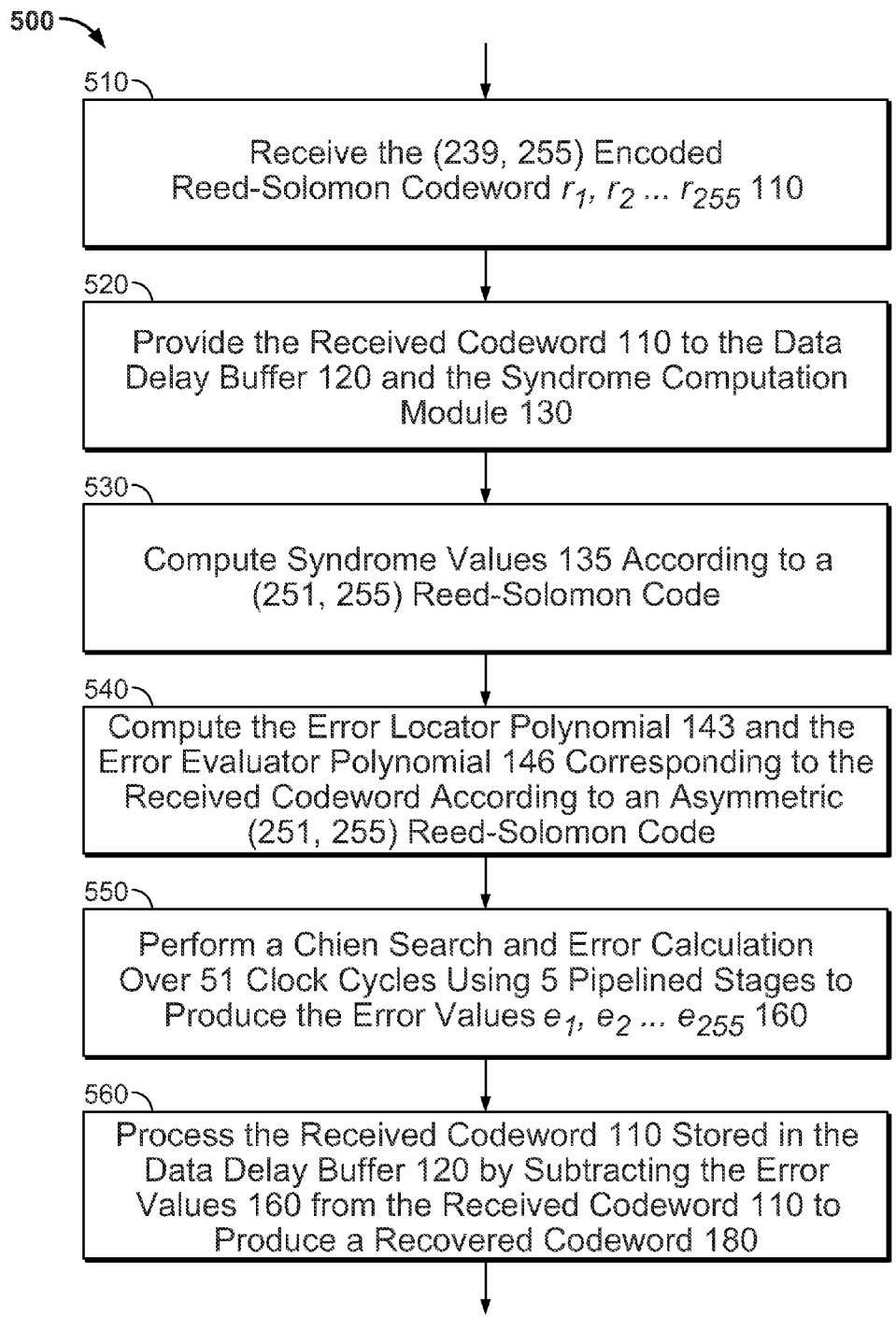
FIG. 5 illustrates a method for decoding a codeword using the decoder depicted in FIG. 1 in accordance with an arrangement of the invention.

FIG. 5 illustrates a method for decoding a codeword using the decoder depicted in FIG. 1 in accordance with an arrangement of the invention. At step 510 of process 500, the decoder 100 receives the codeword 110 which is a (239, 255) encoded Reed-Solomon codeword. At step 520, the decoder 100 provides the received codeword 110 to the data delay buffer 120 and the syndrome computation module 130. At step 530, the syndrome computation module 130 processes the received codeword 110 to produce the syndrome values 135, which the decoder 100 then provides to the error locator polynomial module 140.

In particular, although a (239, 255) Reed-Solomon codeword is received at the step 510, the syndrome computation module 130 processes the codeword using fewer check symbols. In particular, the syndrome computation module 130 processes the received codeword 100 asymmetrically according to a (251, 255) Reed-Solomon code to produce the syndrome values 135.

At step 540, the error locator polynomial module 140 computes the error locator polynomial 143 and the error evaluator polynomial 146 corresponding to the received codeword 110 and according to the asymmetric (251, 255) Reed-Solomon code. At step 550, the Chien search and error calculation module 150 performs a Chien search and error evaluation to produce the error values 160. In one particular arrangement, the Chien search and error calculation module uses p=5 parallel stages so that 5 error values from the set of error values $e_0$ through $e_{254}$ are computed during each clock cycle until all error values are computed. This takes 51 clock cycles. At step 560, the recovered codeword 180 is produced by retrieving the received codeword 110 from the data delay buffer 120 and subtracting, on an element-wise basis, the non-zero error values 160 from the corresponding locations of the received codeword 110 using the adder 170.

Although the present disclosure has been described primarily in terms of an asymmetric (251, 255) Reed-Solomon decoder with a correction power of t=2, it will be understood by one of ordinary skill, based on the disclosure and teachings herein, that other types of decoders may be used. For example, other binary or non-binary Galois-field-based decoders may be implemented using the teachings herein. Further, correction powers other than t=2 may be used. For example, if a (239, 255) Reed-Solomon code is transmitted, a (249, 255) asymmetric Reed-Solomon decoder may be used (t=3). The equations (5) and (6) would then include one additional polynomial term each and the circuitries 400 and 450 would include additional logic to process these additional coefficients.

Further, it will be understood that the foregoing is only illustrative of the principles of the invention, and that various modifications may be made by those skilled in the art without departing from the scope and spirit of the invention, and the present invention is limited only by the claims that follow.

What is claimed is:

1. Codeword processing circuitry comprising:
    decoding circuitry comprising:
    syndrome computation circuitry configured to:
        receive a codeword encoded with a first number of check symbols; and
        asymmetrically process the received codeword according to a second number of check symbols, wherein the second number of check symbols is less than the first number of check symbols, to produce a plurality of syndrome values;
    error locator polynomial circuitry configured to:
    process the plurality of syndrome values to produce an error locator polynomial and an error evaluator polynomial corresponding to the received codeword,
    produce a derivative of the error locator polynomial by outputting a first polynomial term and a second polynomial term, wherein the second polynomial term is a constant,
    output an inverse of a denominator of the first polynomial term using a variable finite-field multiplier by processing a corresponding input over a plurality of clock cycles; and
    data recovery circuitry configured to process the received codeword using a plurality of error values to produce a recovered codeword.

2. The codeword processing circuitry of claim 1, wherein the decoding circuitry includes at most one variable finite-field divider, said at most one variable finite-field divider included in the error locator polynomial circuitry.

3. The codeword processing circuitry of claim 1, wherein the decoding circuitry further comprises error search and calculation circuitry configured to produce the plurality of error values based on the error locator polynomial and the error evaluator polynomial, and wherein the decoding circuitry is further configured to provide the plurality of error values to the data recovery circuitry.

4. The codeword processing circuitry of claim 3, wherein:
    the decoding circuitry is further configured to provide the received codeword to a data delay buffer; and
    the data delay buffer is configured to delay an output of the received codeword for a number of clock cycles required for the syndrome computation circuitry, the error locator polynomial circuitry, and the error search and calculation circuitry to asymmetrically process the received codeword.

5. The codeword processing circuitry of claim 3, wherein the error search and calculation circuitry is further configured to:
perform an error search and calculation corresponding to each of p symbol locations of the received codeword in p parallel stages, wherein p is an integer greater than one; and
output a corresponding plurality of p error values in a clock cycle.

6. The codeword processing circuitry of claim 1, wherein the error locator polynomial circuitry is further configured to output the inverse of the denominator of the first polynomial term by using an inverse power of a root of the error locator polynomial.

7. Decoding circuitry comprising:
syndrome computation circuitry configured to process a received codeword to produce a plurality of syndrome values;
error locator polynomial circuitry configured to:
process the plurality of syndrome values to produce an error locator polynomial and an error evaluator polynomial corresponding to the received codeword,
produce a derivative of the error locator polynomial by outputting a first polynomial term and a second polynomial term, wherein the second polynomial term is a constant, and
output an inverse of a denominator of the first polynomial term using a variable finite-field multiplier by processing a corresponding input over a plurality of clock cycles;
error search and calculation circuitry configured in a plurality of p parallel stages to output, in a single clock cycle, a corresponding plurality of p error values for the received codeword based on the error locator polynomial and the error evaluator polynomial, wherein p is an integer greater than one; and
codeword recovery circuitry configured to produce a recovered codeword by modifying the received codeword using the plurality of p error values.

8. The decoding circuitry of claim 7, wherein the decoding circuitry includes exactly one variable divider, said variable divider included in the error locator polynomial circuitry.

9. The decoding circuitry of claim 7, wherein the decoding circuitry includes p variable finite-field multipliers, wherein each variable finite-field multiplier of said p variable finite-field multipliers is included in a respective parallel stage of error search and calculation circuitry of the plurality of p parallel stages of the error search and calculation circuitry.

10. The decoding circuitry of claim 7, wherein the decoding circuitry includes at most p variable finite-field multipliers and includes no variable dividers.

11. The decoding circuitry of claim 7, wherein the error locator polynomial circuitry is further configured to output the inverse of the denominator of the first polynomial term by using an inverse power of a root of the error locator polynomial.

12. A method of processing a codeword comprising:
receiving a codeword encoded with a first number of check symbols;
asymmetrically processing the received codeword according to a second number of check symbols, wherein the second number of check symbols is less than the first number of check symbols, to produce a plurality of syndrome values;
processing the plurality of syndrome values to produce an error locator polynomial and an error evaluator polynomial corresponding to the received codeword and the second number of check symbols;
producing a derivative of the error locator polynomial by outputting a first polynomial term and a second polynomial term, wherein the second polynomial term is a constant;
outputting an inverse of a denominator of the first polynomial term using a variable finite-field multiplier by processing a corresponding input over a plurality of clock cycles;
producing a plurality of error values based on the error locator polynomial and the error evaluator polynomial; and
modifying the received codeword based on the plurality of error values to produce a recovered codeword.

13. The method of claim 12, wherein producing the derivative of the error locator polynomial is performed using the variable finite-field multiplier and without use of a divider.

14. Decoding circuitry comprising:
error locator polynomial circuitry configured to:
process a received codeword according to a symmetric decoding scheme to produce an error locator polynomial and an error evaluator polynomial corresponding to the received codeword,
produce a derivative of the error locator polynomial by outputting a first polynomial term and a second polynomial term, wherein the second polynomial term is a constant, and
output an inverse of a denominator of the first polynomial term using a variable finite-field multiplier by processing a corresponding input over a plurality of clock cycles;
error search and calculation circuitry configured in a plurality of p parallel stages to output, in a single clock cycle, a corresponding plurality of p error values for the received codeword based on the error locator polynomial and the error evaluator polynomial and the symmetric decoding scheme, wherein p is an integer greater than one; and
codeword recovery circuitry configured to produce a recovered codeword by modifying the received codeword.

15. The decoding circuitry of claim 14, wherein:
the received codeword is a (251, 255) encoded Reed-Solomon codeword, and
each of the error locator polynomial circuitry and the error search and calculation circuitry process the received codeword according to a symmetric (251, 255) Reed-Solomon decoding scheme.

* * * * *